(12) United States Patent
Zamudio et al.

(10) Patent No.: US 10,203,461 B2
(45) Date of Patent: Feb. 12, 2019

(54) TECHNIQUES FOR FORMING WAVEGUIDES FOR USE IN LASER SYSTEMS OR OTHER SYSTEMS AND ASSOCIATED DEVICES

(71) Applicant: Raytheon Company, Waltham, MA (US)

(72) Inventors: Roy Zamudio, Quartz Hill, CA (US); Makan Mohageg, Granada Hills, CA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 14/845,916

(22) Filed: Sep. 4, 2015

(65) Prior Publication Data

US 2017/0068058 A1    Mar. 9, 2017

(51) Int. Cl.

| | |
|---|---|
| *G02B 6/12* | (2006.01) |
| *G02B 6/10* | (2006.01) |
| *G02B 6/42* | (2006.01) |
| *G02B 6/122* | (2006.01) |
| *G02B 6/132* | (2006.01) |
| *C23C 14/35* | (2006.01) |
| *C23C 14/34* | (2006.01) |
| *H01S 3/063* | (2006.01) |
| *H01S 3/23* | (2006.01) |
| *H01S 3/042* | (2006.01) |
| *H01S 3/16* | (2006.01) |

(52) U.S. Cl.
CPC ........ *G02B 6/4272* (2013.01); *C23C 14/3471* (2013.01); *C23C 14/35* (2013.01); *G02B 6/122* (2013.01); *G02B 6/132* (2013.01); *H01S 3/042* (2013.01); *H01S 3/0632* (2013.01); *H01S 3/2308* (2013.01); *H01S 3/1643* (2013.01)

(58) Field of Classification Search
CPC .... G02B 6/4271; G02B 6/132; G02B 6/4269; G02B 6/4267; H01S 5/024; H05K 1/0203; C23C 14/3471; C23C 14/541
USPC ............ 385/14, 49, 129–132; 359/333, 346; 372/34–36
See application file for complete search history.

(56) References Cited

U.S. PATENT DOCUMENTS

| | | | |
|---|---|---|---|
| 8,233,513 B1 * | 7/2012 | Schleuning | ......... H01S 5/02469 327/33 |
| 2003/0063884 A1 * | 4/2003 | Smith | .................... G02B 6/032 385/129 |

(Continued)

FOREIGN PATENT DOCUMENTS

| | | |
|---|---|---|
| EP | 1988414 A1 | 11/2008 |
| GB | 2371404 A | 7/2002 |

OTHER PUBLICATIONS

Deng, et al.; "Thin Film rf Magnetron Sputtering of Gadolinium-Doped Yttrium Aluminum Garnet Ultraviolet Emitting Materials"; Optical Materials 29.2; 2006; 9 pages.

(Continued)

*Primary Examiner* — Hung Lam

(57) ABSTRACT

A method includes forming a coating that covers at least part of a conduction substrate, where the conduction substrate is configured to transport thermal energy. The method also includes forming at least part of an optical waveguide on the coating. The optical waveguide includes multiple cladding layers and a core, and the optical waveguide is configured to transport optical signals. The conduction substrate, the coating, and the optical waveguide form an integrated monolithic waveguide structure.

20 Claims, 5 Drawing Sheets

(56) References Cited

U.S. PATENT DOCUMENTS

| | | | |
|---|---|---|---|
| 2011/0142392 A1 | 6/2011 | Tilly | |
| 2013/0243020 A1* | 9/2013 | Kim | H01S 5/0224 372/36 |
| 2014/0133504 A1* | 5/2014 | Stojetz | H01S 5/2022 372/44.01 |
| 2014/0185640 A1* | 7/2014 | Jain | B82Y 20/00 372/45.011 |

OTHER PUBLICATIONS

Aculon Performance Surface Solutions; "Repellency Treatments for Electronics"; retrieved from Wayback Machine: www.aculon.com/treatments-electronics.php; Apr. 2014; 3 pages.

Micro Cooling Concepts: Laser Diode Coolers; "No-Stress Heat Spreaders"; retrieved from microcoolingconcepts.com/impinge.htm; Copyright 2000-2002; 3 pages.

Micro Cooling Concepts: Laser Diode Coolers; "Single-Bar Coolers (SBC)"; retrieved from microcoolingconcepts.com/impinge/sbc.htm; Copyright 2000-2002; 5 pages.

Micro Cooling Concepts: Laser Diode Coolers; "SA-2 Cooler"; retrieved from microcoolingconcepts.com/impinge/sa2.htm; Copyright 2000-2002; 6 pages.

Notification of Transmittal of The International Search Report and The Written Opinion of The International Searching Authority, of the Declaration dated Sep. 27, 2016 in connection with International Patent Application No. PCT/US2016/040850.

Notice of Preliminary Rejection dated Aug. 29, 2018 in connection with corresponding Korean Patent Application No. 10-2017-7036731, 13 pages.

* cited by examiner

TECHNIQUES FOR FORMING WAVEGUIDES FOR USE IN LASER SYSTEMS OR OTHER SYSTEMS AND ASSOCIATED DEVICES

TECHNICAL FIELD

This disclosure is directed generally to waveguides for use in high-energy laser systems and other systems. More specifically, this disclosure relates to techniques for forming waveguides for use in laser systems or other systems and associated devices.

BACKGROUND

High-energy laser (HEL) systems generally refer to systems that generate laser outputs at elevated energy levels, such as laser outputs of about 50 kilowatts or more. In these types of laser systems or other systems, cooling a laser gain medium is often a principal engineering challenge. Conventional laser systems use a variety of approaches to help cool their gain media. These approaches include using direct cooling via water or other liquid or using advanced cooler systems such as microchannel coolers. These approaches also include changing a waveguide's geometry to balance thermal gradients or using laser cooling of solids.

SUMMARY

This disclosure provides techniques for forming waveguides for use in laser systems or other systems and associated devices.

In a first embodiment, a method includes forming a coating that covers at least part of a conduction substrate, where the conduction substrate is configured to transport thermal energy. The method also includes forming at least part of an optical waveguide on the coating. The optical waveguide includes multiple cladding layers and a core, and the optical waveguide is configured to transport optical signals. The conduction substrate, the coating, and the optical waveguide form an integrated monolithic waveguide structure.

In a second embodiment, a method includes forming a coating that covers at least part of a conduction substrate, where the conduction substrate is configured to transport thermal energy. The method also includes forming an optical waveguide on the coating. The optical waveguide includes multiple cladding layers and a core, and the optical waveguide is configured to transport optical signals. The conduction substrate, the coating, and the optical waveguide form an integrated monolithic waveguide structure. Forming the optical waveguide includes forming the core of the optical waveguide by performing repeated depositions to form multiple core layers of the core.

In a third embodiment, an apparatus includes a conduction substrate configured to transport thermal energy and a coating that covers at least part of the conduction substrate. The apparatus also includes an optical waveguide attached to the coating. The optical waveguide includes multiple cladding layers and a core, and the optical waveguide is configured to transport optical signals. The conduction substrate, the coating, and the optical waveguide form an integrated monolithic waveguide structure.

Other technical features may be readily apparent to one skilled in the art from the following figures, descriptions, and claims.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

FIGS. 1 through 5, described below, and the various embodiments used to describe the principles of the present invention in this patent document are by way of illustration only and should not be construed in any way to limit the scope of the invention. Those skilled in the art will understand that the principles of the present invention may be implemented in any type of suitably arranged device or system.

As noted above, conventional laser systems use a variety of approaches to help cool their laser gain media. These approaches include using direct liquid cooling, advanced cooler systems, changes to a waveguide's geometry, and laser cooling of solids. However, in all of these approaches, a thermal interface material (TIM) is typically used as an interfacial layer between different materials in the conventional laser systems. A thermal interface material denotes a material designed to facilitate the transfer of thermal energy.

Unfortunately, the thermal interface material is itself often a potential cause of laser failure, and the thermal conductivity of the thermal interface material creates an overall performance limitation on a laser system. Moreover, there are lifetime and contamination issues associated with the use of a thermal interface material. For instance, the use of a thermal interface material can cause excessive non-uniform heating, which can lead to performance degradation or component failure. In addition, some conventional systems that use thermal interface materials can have exacting requirements and require substantial handling of critical hardware, which increases the cost and complexity of manufacturing those systems.

This disclosure provides various waveguides and various techniques for forming the waveguides for use in high-energy laser systems and other systems. The waveguides and techniques described in this patent document overcome many of the problems experienced during the fabrication or use of conventional waveguides in high-energy laser systems or other systems. For example, the waveguides and techniques described here can reduce or completely eliminate the use of thermal interface materials. Moreover, the waveguides and techniques described here can help to simplify assembly of laser systems and improve thermal performance substantially.

Figure 1:
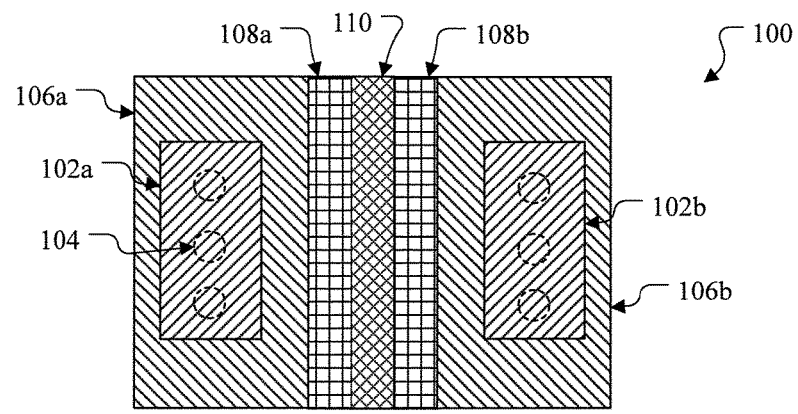
FIG. 1 illustrates a first example waveguide structure for a laser system or other system according to this disclosure.

FIG. 1 illustrates a first example waveguide structure 100 for a laser system or other system according to this disclosure. As shown in FIG. 1, the waveguide structure 100 includes conduction substrates 102a-102b, which generally represent structures configured to thermally conduct heat away from the waveguide structure 100. The conduction substrates 102a-102b could be formed from any suitable material(s), such as copper (Cu), a copper alloy like copper tungsten (CuW), or a dielectric. The material(s) forming the conduction substrates 102a-102b could have a coefficient of thermal expansion (CTE) substantially equal to the CTE of the laser gain medium with which the conduction substrates 102a-102b are used. The conduction substrates 102a-102b could also have any suitable form factor, such as a solid structure or a tube or other hollow structure. As a particular example, the conduction substrates 102a-102b could represent microchannel coolers each having one or more channels 104 through which coolant could flow. The conduction substrates 102a-102b could further be formed in any suitable manner, such as by casting, injection molding, or etching.

The waveguide structure 100 also includes hard coatings 106a-106b, which at least partially surround the conduction substrates 102a-102b, respectively. The hard coatings 106a-106b help to provide protection for the conduction substrates 102a-102b and to transport thermal energy to the conduction substrates 102a-102b. The hard coatings 106a-106b could be formed from any suitable material(s), such as a hydrophobic or hydrophilic material like sapphire. Also, the hard coatings 106a-106b could be formed in any suitable manner, such as by using a nanoscale treatment technique. In addition, each of the hard coatings 106a-106b could have any suitable thickness.

The waveguide structure 100 further includes a planar waveguide formed using cladding layers 108a-108b and a core 110. The cladding layers 108a-108b generally denote structures having a lower refractive index than the core 110. Each of the cladding layers 108a-108b could be formed from any suitable material(s), such as a thin film yttrium aluminum garnet (YAG) crystal. The cladding layers 108a-108b could also be formed in any suitable manner, such as via an electrolytic coating or thermal spray coating technique, a radio frequency (RF) magnetron sputtering technique, a laser-assisted ion sputtering technique, a molecular beam epitaxy technique, or a "sol-gel" technique. In addition, each of the cladding layers 108a-108b could have any suitable thickness.

The core 110 can be used to transport high-energy laser signals or other optical signals through the waveguide structure 100 while providing a gain to the optical signals. The core 110 could be formed from any suitable material(s), such as a doped YAG material. The core 110 could also be formed in any suitable manner and have any suitable thickness.

The waveguide structure 100 here can be used in various applications to transport optical signals, such as high-energy laser (HEL) signals. During operation, heat generated in the core 110 and the cladding layers 108a-108b is transported to the conduction substrates 102a-102b through the hard coatings 106a-106b. The conduction substrates 102a-102b can then transport the heat away from the waveguide structure 100 (either by themselves or via coolant flowing through the conduction substrates), helping to cool the waveguide structure 100. The hard coatings 106a-106b act as thermal interfaces to the conduction substrates 102a-102b, helping to facilitate easier transfer of heat generated within the waveguide structure 100 to the conduction substrates 102a-102b. This can help to improve the performance of the waveguide structure 100 and reduce system failures. Moreover, this structure can be fabricated much easier than conventional waveguides, helping to reduce wait times and costs associated with the waveguide structure 100.

Although FIG. 1 illustrates a first example of a waveguide structure 100 for a laser system or other system, various changes may be made to FIG. 1. For example, the relative sizes, shapes, and dimensions of the various components shown in FIG. 1 are for illustration only. Each component in FIG. 1 could have any other size, shape, and dimensions. Also, while each side of the waveguide formed by the cladding layers 108a-108b and the core 110 includes a single conduction substrate, each side of the waveguide could include any number of conduction substrates. For instance, each side of the waveguide could include multiple conduction substrates in any suitable arrangement, or one side of the waveguide could include no conduction substrates while the other side of the waveguide includes one or more conduction substrates. In general, any suitable arrangement of conduction substrates with respect to the waveguide could be used.

Figure 2A:
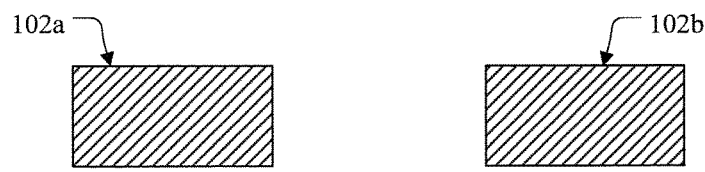
FIGS. 2A through 2E illustrate an example technique for forming the waveguide structure of FIG. 1 according to this disclosure.

FIGS. 2A through 2E illustrate an example technique for forming the waveguide structure 100 of FIG. 1 according to this disclosure. As shown in FIG. 2A, the process begins with the conduction substrates 102a-102b. The conduction substrates 102a-102b could be obtained in any suitable manner, such as by manufacturing the conduction substrates 102a-102b or by obtaining the conduction substrates 102a-102b from another party. While not shown in FIG. 2A as having channels 104, each of the conduction substrates 102a-102b could have any suitable form factor with or without one or more channels 104.

Figure 2B:
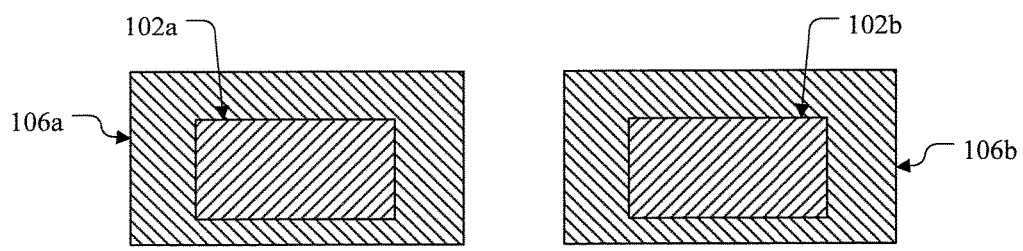

As shown in FIG. 2B, the hard coatings 106a-106b are formed on the conduction substrates 102a-102b, respectively. The hard coatings 106a-106b could be formed from sapphire or other material(s) that provide good thermal conductivity to the conduction substrates 102a-102b. The hard coatings 106a-106b could also be formed in any suitable manner, such as by using a nanoscale treatment technique.

Figure 2C:
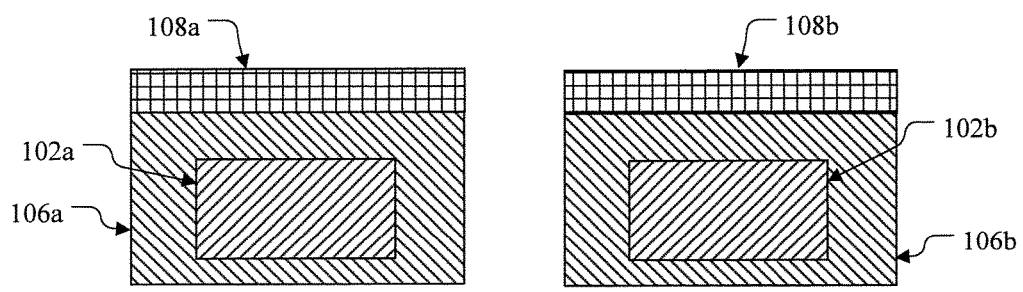

As shown in FIG. 2C, the cladding layers 108a-108b are formed on the hard coatings 106a-106b, respectively. Each of the cladding layers 108a-108b could be formed as a low-grade YAG crystal or other suitable material(s) that provide a cladding for optical signals. The cladding layers 108a-108b could also be formed in any suitable manner, such as via an electrolytic or thermal spray coating technique, an RF magnetron sputtering technique, a laser-assisted ion sputtering technique, a molecular beam epitaxy technique, or a "sol-gel" technique.

Figure 2D:
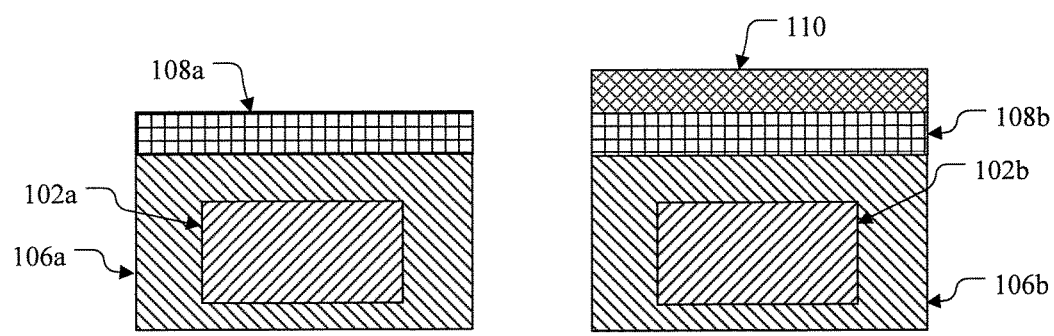

As shown in FIG. 2D, the core 110 is placed or formed on one of the cladding layers (layer 108b in this example). The core 110 could be formed from any suitable material(s), such as doped YAG or other solid-state gain material. The core 110 could also be formed in any suitable manner. Note that the core 110 could be formed on the cladding layer 108b directly or formed separately and then attached to the cladding layer 108b. For instance, the core 110 could be formed separately and then attached to the cladding layer 108b via a diffusion bonding or brazing process.

Figure 2E:
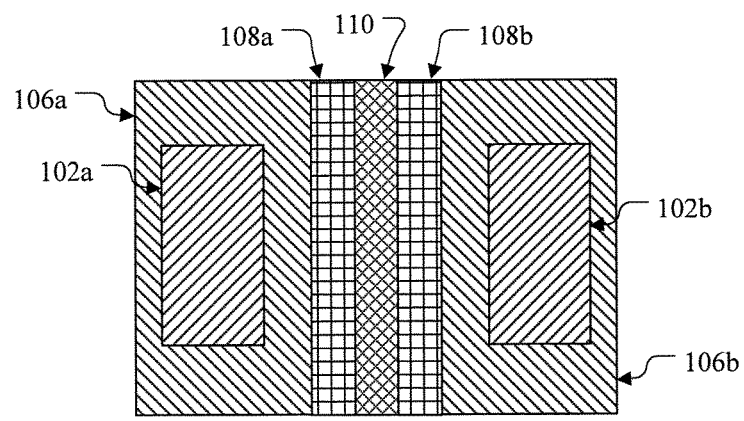

As shown in FIG. 2E, the core 110 is attached to the other cladding layer (layer 108a in this example). This could occur in any suitable manner, such as via a diffusion bonding or brazing process. In some embodiments, the overall process results in the creation of a monolithic structure. At this point, the resulting structure can be further processed to complete the formation of a usable waveguide. For example, surfaces of the structure can be polished to create the desired final shape of the waveguide.

The net result of this process can be an essentially monolithic stack of:
- a first mechanical structure and optional coolant line (conduction substrate 102a);
- a first optically-inert thermal interface (hard coating 106a);
- a planar waveguide (cladding layers 108a-108b and core 110);
- a second optically-inert thermal interface (hard coating 106b); and
- a second mechanical structure and optional coolant line (conduction substrate 102b).

The resulting waveguide structure 100 can be used in a variety of ways. For example, the waveguide structure 100 could be integrated into a slab waveguide amplifier or other structure for use in an HEL system or other system.

Although FIGS. 2A through 2E illustrate one example of a technique for forming the waveguide structure 100 of FIG. 1, various changes may be made to FIGS. 2A through 2E. For example, rather than forming one cladding layer 108a-108b on each structure in FIG. 2C, only one cladding layer 108b may be formed on one of the structures. The core 110 could then be placed or formed on the cladding layer 108b, and the other cladding layer 108a could be formed on the core 110. The cladding layer 108a could then be bonded to the hard coating 106a, such as via a diffusion bonding or brazing process. As another example, the cladding layers 108a-108b can be formed on both structures in FIG. 2C, and multiple cores 110 can be formed on both structures in FIG. 2D. The cores 110 could be then attached to one another during the processing in FIG. 2E. In general, any suitable technique that forms an integrated structure having a waveguide and one or more conduction substrates with a hard coating supporting thermal transport could be used.

Figure 3:
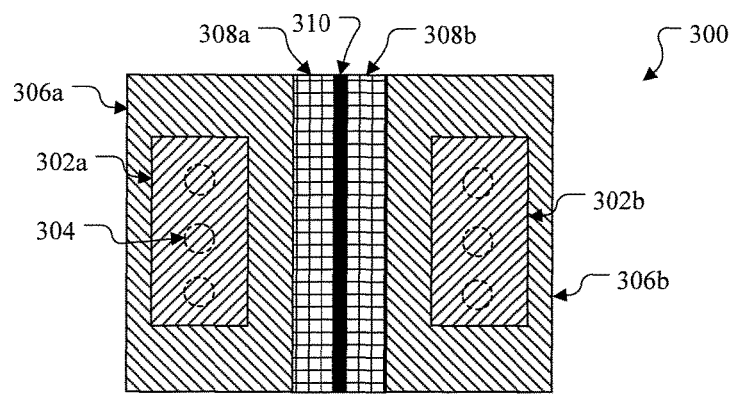
FIG. 3 illustrates a second example waveguide structure for a laser system or other system according to this disclosure.

FIG. 3 illustrates a second example waveguide structure 300 for a laser system or other system according to this disclosure. As shown in FIG. 3, the waveguide structure 300 includes conduction substrates 302a-302b (each with or without channels 304), hard coatings 306a-306b, and cladding layers 308a-308b. These components could be the same as or similar to the corresponding components in FIG. 1 described above.

The waveguide structure 300 also includes a core 310, which is formed via a direct deposition of doped solid-state gain material. The core 310 could be formed from any suitable material(s), such as ytterbium-doped YAG (Yb:YAG) or other doped YAG. The core 310 could also be formed in any suitable manner, such as via an RF magnetron sputtering technique, a laser-assisted ion sputtering technique, a molecular beam epitaxy technique, or a "sol-gel" technique.

In some embodiments, the core 310 can be formed using repeated depositions of core layers via a suitable technique. This allows the core 310 to be built up layer-by-layer until a suitable thickness is achieved. Moreover, the process can be suspended at any time to allow other operations to occur, such as polishing of existing core layers in preparation for the deposition of additional core layers.

Although FIG. 3 illustrates a second example of a waveguide structure 300 for a laser system or other system, various changes may be made to FIG. 3. For example, the relative sizes, shapes, and dimensions of the various components shown in FIG. 3 are for illustration only. Each component in FIG. 3 could have any other size, shape, and dimensions. Also, while each side of the waveguide formed by the cladding layers 308a-308b and the core 310 includes a single conduction substrate, each side of the waveguide could include any number of conduction substrates. For instance, each side of the waveguide could include multiple conduction substrates in any suitable arrangement, or one side of the waveguide could include no conduction substrates while the other side of the waveguide includes one or more conduction substrates. In general, any suitable arrangement of conduction substrates with respect to the waveguide could be used.

Figure 4A:
FIGS. 4A through 4F illustrate an example technique for forming the waveguide structure of FIG. 3 according to this disclosure.

FIGS. 4A through 4F illustrate an example technique for forming the waveguide structure 300 of FIG. 3 according to this disclosure. As shown in FIG. 4A, the process begins with the conduction substrates 302a-302b. The conduction substrates 302a-302b could be obtained in any suitable manner, such as by manufacturing the conduction substrates 302a-302b or by obtaining the conduction substrates 302a-302b from another party. While not shown in FIG. 4A as having channels 304, each of the conduction substrates 302a-302b could have any suitable form factor with or without one or more channels 304.

Figure 4B:
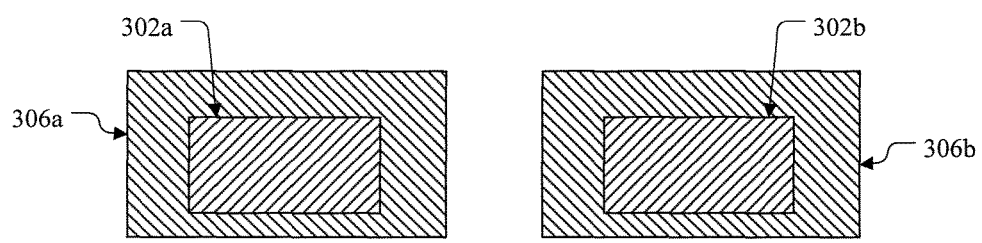

As shown in FIG. 4B, the hard coatings 306a-306b are formed on the conduction substrates 302a-302b, respectively. The hard coatings 306a-306b could be formed from sapphire or other material(s) that provide good thermal conductivity to the conduction substrates 302a-302b. The hard coatings 306a-306b could also be formed in any suitable manner, such as by using a nanoscale treatment technique.

Figure 4C:
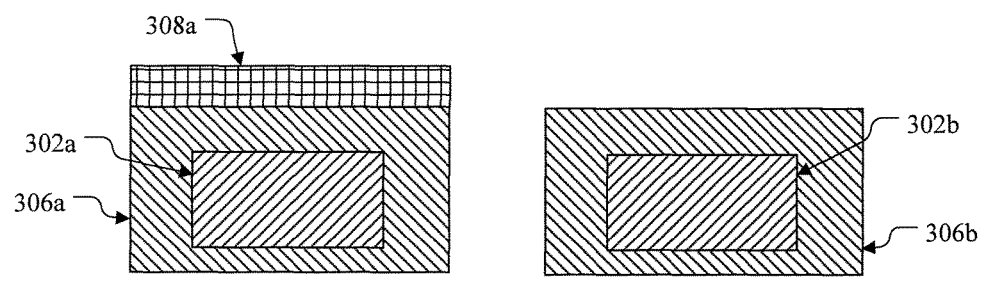

As shown in FIG. 4C, the cladding layer 308a is formed on the hard coating 306a. The cladding layer 308a could be formed as a high-grade YAG crystal or other suitable material(s) that provide a cladding for optical signals. The cladding layer 308a could also be formed in any suitable manner, such as via an RF magnetron sputtering technique, a laser-assisted ion sputtering technique, a molecular beam epitaxy technique, or a "sol-gel" technique.

Figure 4D:
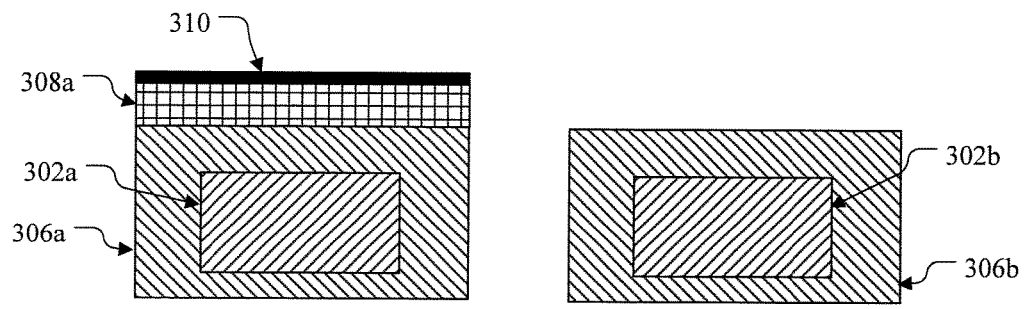

As shown in FIG. 4D, the core 310 is formed on the cladding layer 308a. The core 310 could be formed from any suitable material(s), such as doped YAG or other solid-state gain material. The core 310 could also be formed in any suitable manner, such as via an RF magnetron sputtering technique, a laser-assisted ion sputtering technique, a molecular beam epitaxy technique, or a "sol-gel" technique. As noted above, the core 310 may or may not be formed using multiple layers of material.

Figure 4E:
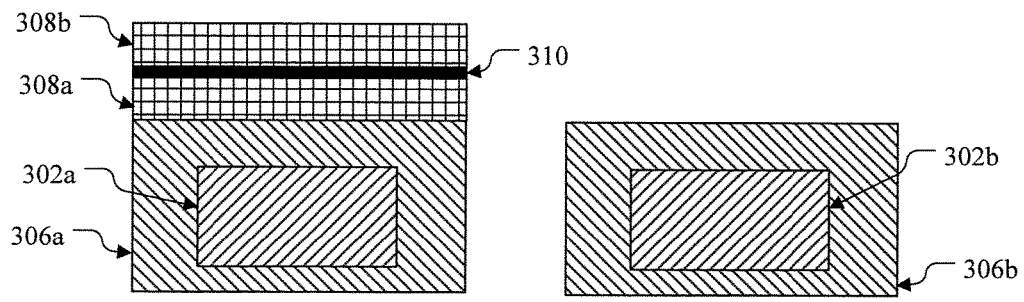

As shown in FIG. 4E, the cladding layer 308b is formed on the core 310. The cladding layer 308b could be formed as a high-grade YAG crystal or other suitable material(s) that provide a cladding for optical signals. The cladding layer 308b could also be formed in any suitable manner, such as via an RF magnetron sputtering technique, a laser-assisted ion sputtering technique, a molecular beam epitaxy technique, or a "sol-gel" technique.

Figure 4F:
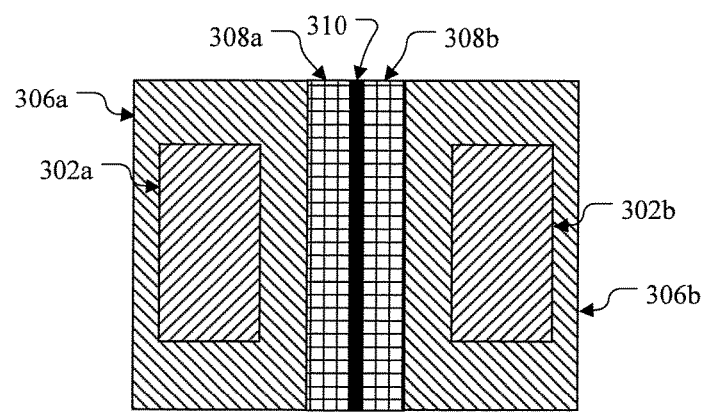

As shown in FIG. 4F, the cladding layer 308b is attached to the hard coating 306b. This could occur in any suitable manner, such as via a diffusion bonding or brazing process. In some embodiments, the overall process results in the creation of a monolithic structure. At this point, the resulting structure can be further processed to complete the formation of a usable waveguide. For example, surfaces of the structure can be polished to create the desired final shape of the waveguide.

The resulting waveguide structure 300 can be used in a variety of ways. For example, the waveguide structure 300 could be integrated into a slab waveguide amplifier or other structure for use in an HEL system or other system. Note that RF magnetron sputtering may be limited in terms of the maximum achievable thickness of the core 310. For example, in some RF magnetron sputtering approaches, the core 310 could be limited to a maximum thickness of about 10 μm. However, in some systems, it is the cross volume of the core 310 (width×height×length) that is the figure of merit, not the height by itself. If the height of the core 310 is shorter than is achievable using some other fabrication technique, the width and/or length of the core 310 could be increased to compensate. Moreover, because of the increased cooling efficiency achievable using the approaches described here, amplifiers with smaller cross volumes and no thermal interface materials could be used to obtain comparable performance as amplifiers with larger cross volumes and thermal interface materials.

As a particular example of this, planar waveguides used in some 50-kilowatt HEL systems can be approximately 100 μm by 25 mm by 100 mm in size. The lead time needed to manufacture these planar waveguides using conventional techniques is measured in many months, and after manufacturing a planar waveguide undergoes cleaning, inspection, and integration into a laser cartridge. The waveguide-to-cartridge interfacial losses determine the cooling rate of the planar waveguide, which combined with the waveguide's area and doping concentration can be used to calculate the total laser power achievable. Using the approaches described in this disclosure, a 10 μm by 50 mm by 200 mm monolithic amplifier could be manufactured in a matter of days, polished over the course of a week, inspected, and installed. Such a monolithic amplifier could provide optical amplification similar to the 50-kilowatt planar waveguide at substantially reduced cost and increased cooling capacity.

Although FIGS. 4A through 4F illustrate one example of a technique for forming the waveguide structure 300 of FIG. 3, various changes may be made to FIGS. 4A through 4F. For example, rather than forming the cladding layers 308a-308b and the core 310 over the same conduction substrate 302a, the cladding layer 308b could be formed on the hard coating 306b and attached to the core 310. As another example, multiple cores 310 could be formed on the cladding layers 308a-308b and attached to one another.

The waveguide structures 100, 300 described here can be manufactured more easily compared to conventional planar waveguides. Moreover, the waveguide structures 100, 300 described here can provide improved cooling of the waveguide structures. Some example simulations have shown that an improvement of at least 25% in cooling efficiency can be obtained, which could offer significant advantages in various types of HEL systems or other systems that use high-power optical signals. In addition, the use of a conventional thermal interface material typically requires that entrance and exit faces of a planar waveguide not be flush with surfaces of a mounting substrate, which decreases cooling efficiency substantially since facet coatings drive absorption. The waveguide structures 100, 300 described here can eliminate this constraint and thus address problems associated with the use of facet coatings.

Figure 5:
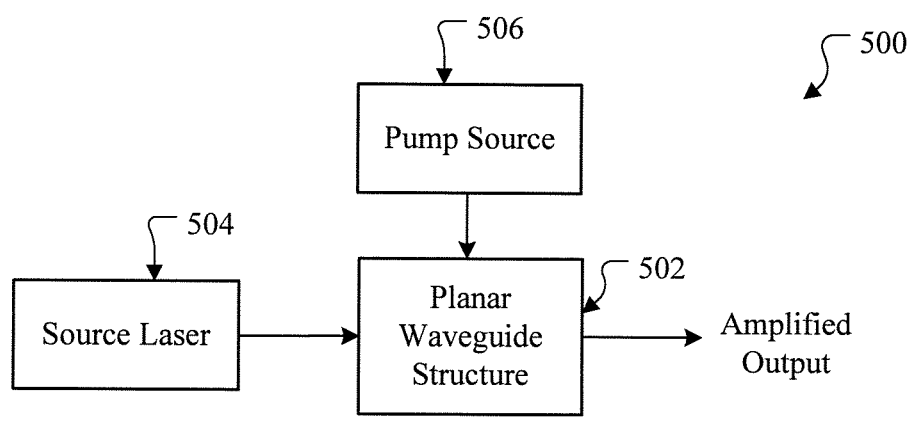
FIG. 5 illustrates an example system having a waveguide according to this disclosure.

FIG. 5 illustrates an example system 500 having a waveguide 502 according to this disclosure. The waveguide 502 shown here could denote the waveguide structure 100 of FIG. 1 or the waveguide structure 300 of FIG. 3. However, as noted above, there are a number of potential modifications that can be made to the waveguide structures 100 and 300, and the waveguide 502 could also incorporate any single potential modification or any combination of potential modifications described above.

The system 500 also includes a source laser 504 and a pump source 506. In this example, the system 500 is arranged to implement a "master oscillator power amplifier" or "MOPA" configuration, which supports the generation of high-power laser outputs. The source laser 504 generally operates to generate a low-power version of a desired output waveform. For example, if the desired output waveform is a high-energy laser output having pulses in a desired pattern, the source laser 504 can generate a lower-power output having pulses in the desired pattern. The output of the source laser 504 is provided to the waveguide 502, which amplifies the output of the source laser 504 to generate an amplified laser output. Laser energy for the amplification is provided to the waveguide 502 by the pump source 506.

The source laser 504 includes any suitable structure for generating a lower-power laser output, such as one or more laser diodes. The pump source 506 includes any suitable structure for providing laser energy to support amplification. For example, the pump source 506 could include one or more laser diodes or one or more flash lamps.

Although FIG. 5 illustrates one example of a system 500 having a waveguide 502, various changes may be made to FIG. 5. For example, laser systems come in a wide variety of configurations, and any laser system in which a planar waveguide is used for amplification or other functions could use the waveguide structure 100 or 300.

It may be advantageous to set forth definitions of certain words and phrases used throughout this patent document. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in the present application should not be read as implying that any particular element, step, or function is an essential or critical element that must be included in the claim scope. The scope of patented subject matter is defined only by the allowed claims. Moreover, none of the claims is intended to invoke 35 U.S.C. § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "system," "processor," or "controller" within a claim is understood and intended to refer to structures known to those skilled in the relevant art, as further modified or enhanced by the features of the claims themselves, and is not intended to invoke 35 U.S.C. § 112(f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the scope of this disclosure, as defined by the following claims.

What is claimed is:

1. A method comprising:
   forming a first coating that surrounds at least a majority of a first conduction substrate, the first conduction substrate configured to transport thermal energy, the majority of the first conduction substrate including multiple surfaces forming a perimeter of the first conduction substrate, the first coating formed of a first hard material that protects the first conduction substrate;
   forming a second coating that surrounds at least a majority of a second conduction substrate, the second conduction substrate configured to transport thermal energy, the majority of the second conduction substrate including multiple surfaces forming a perimeter of the second conduction substrate, the second coating formed of a second hard material that protects the second conduction substrate; and
   attaching an optical waveguide to the first and second coating, the optical waveguide comprising multiple cladding layers and a core, the optical waveguide configured to transport optical signals;
   wherein the first and second conduction substrates, the first and second coatings, and the optical waveguide for in an integrated monolithic waveguide structure.

2. The method of claim 1, wherein attaching the optical waveguide to the first and second coatings comprises:
   forming a first part of the optical waveguide on the first coating;
   forming a second part of the optical waveguide on the second coating; and
   attaching the first and second parts of the optical waveguide.

3. The method of claim 2, wherein the first part of the optical waveguide comprises a first of the cladding layers and the core; the second part of the optical waveguide comprises a second of the cladding layers; and attaching the first and second parts of the optical waveguide comprises attaching the second cladding layer to the core.

4. The method of claim 3, wherein attaching the second cladding layer to the core comprises attaching the second cladding layer to the core using a diffusion bonding process.

5. The method of claim 1, wherein attaching the optical waveguide to the first and second coatings comprises:
   forming the optical waveguide on the first coating; and
   attaching the second coating to the optical waveguide.

6. The method of claim 5, wherein forming the optical waveguide comprises:
   forming the core of the optical waveguide by performing repeated depositions to form multiple core layers of the core.

7. The method of claim 6, wherein deposition of the multiple core layers is suspended to enable one or more additional operations to occur on one or more existing core layers prior to deposition of one or more additional core layers.

8. A method comprising:
   forming a first coating that surrounds at least a majority of a first conduction substrate, the first conduction substrate configured to transport thermal energy, the majority of the first conduction substrate including multiple surfaces forming a perimeter of the first conduction substrate, the first coating formed of a first hard material that protects the first conduction substrate;
   forming an optical waveguide on the first coating, the optical waveguide comprising multiple cladding layers and a core, the optical waveguide configured to transport optical signals;
   forming a second coating that surrounds at least a majority of a second conduction substrate, the second conduction substrate configured to transport thermal energy, the majority of the second conduction substrate including multiple surfaces forming a perimeter of the second conduction substrate, the second coating formed of a second hard material that protects the second conduction substrate; and
   attaching the second coating to the optical waveguide;
   wherein the first and second conduction substrates, the first and second coatings, and the optical waveguide form an integrated monolithic waveguide structure; and
   wherein forming the optical waveguide comprises forming the core of the optical waveguide by performing repeated depositions to form multiple core layers of the core.

9. The method of claim 8, wherein deposition of the multiple core layers is suspended to enable one or more additional operations to occur on one or more existing core layers prior to deposition of one or more additional core layers.

10. The method of claim 9, wherein the one or more additional operations comprise polishing of the one or more existing core layers.

11. The method of claim 8, wherein performing the repeated depositions comprises using at least one of: a radio frequency (RF) magnetron sputtering technique, a laser-assisted ion sputtering technique, a molecular beam epitaxy technique, and a sol-gel technique.

12. The method of claim 8, wherein performing the repeated depositions comprises performing repeated depositions of a doped solid-state gain material.

13. An apparatus comprising:
   a first conduction substrate configured to transport thermal energy;
   a first coating that surrounds at least a majority of the first conduction substrate, the majority of the first conduction substrate including multiple surfaces forming a perimeter of the first conduction substrate, the first coating formed of a first hard material that protects the first conduction substrate;
   a second conduction substrate configured to transport thermal enemy;
   a second coating that surrounds at least a majority of the second conduction substrate, the majority of the second conduction substrate including multiple surfaces forming a perimeter of the second conduction substrate, the second coating formed of a second hard material that protects the second conduction substrate; and
   an optical waveguide attached to the first and second coatings, the optical waveguide comprising multiple cladding layers and a core, the optical waveguide configured to transport optical signals;
   wherein the first and second conduction substrates, the first and second coatings, and the optical waveguide form an integrated monolithic waveguide structure.

14. The apparatus of claim 13, wherein:
   the first and second coatings are configured to provide thermal energy generated by the optical waveguide to the first and second conduction substrates; and
   at least one of the first hard material and the second hard material comprises sapphire.

15. The apparatus of claim 13, wherein at least one of the first and second conduction substrates comprises one or more channels configured to receive a coolant flow.

16. The apparatus of claim 13, wherein the integrated monolithic waveguide structure forms at least part of a planar waveguide that is configured to provide optical amplification.

17. The apparatus of claim 16, further comprising:
a source laser configured to provide an optical input to the planar waveguide; and
a pump source configured to provide optical energy to the planar waveguide;
wherein the planar waveguide is configured to generate an amplified version of the optical input from the source laser using the optical energy from the pump source.

18. The apparatus of claim 13, wherein the core of the optical waveguide comprises multiple layers of doped solid-state gain material.

19. The apparatus of claim 13, wherein at least one of the first hard material and the second hard material comprises sapphire.

20. The apparatus of claim 13, wherein the core of optical waveguide is formed by repeated depositions of multiple core layers of the core.

\* \* \* \* \*